United States Patent
Inoue

(10) Patent No.: US 7,642,581 B2
(45) Date of Patent: Jan. 5, 2010

(54) SOLID-STATE IMAGE SENSING DEVICE

(75) Inventor: Shunsuke Inoue, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 12/259,350

(22) Filed: Oct. 28, 2008

(65) Prior Publication Data

US 2009/0050945 A1 Feb. 26, 2009

Related U.S. Application Data

(62) Division of application No. 11/448,020, filed on Jun. 7, 2006, now Pat. No. 7,456,453.

(30) Foreign Application Priority Data

Jun. 10, 2005 (JP) .............................. 2005-171659

(51) Int. Cl.
*H01L 31/062* (2006.01)
(52) U.S. Cl. .................. 257/292; 257/239; 257/290; 257/291; 257/293; 257/294; 257/435; 257/E27.13; 257/E27.132; 257/E27.133; 257/E27.151
(58) Field of Classification Search .............. 257/239, 257/290–294, 435, E27.13, E27.132, E27.133, 257/E27.151
See application file for complete search history.

(56) References Cited

U.S. PATENT DOCUMENTS

| 5,204,544 | A | 4/1993 | Inoue et al. | 257/462 |
|---|---|---|---|---|
| 7,005,689 | B2* | 2/2006 | Song et al. | 257/290 |
| 7,057,219 | B2* | 6/2006 | Park et al. | 257/292 |
| 7,126,102 | B2 | 10/2006 | Inoue et al. | 250/214 |
| 7,250,647 | B2* | 7/2007 | Rhodes | 257/292 |
| 2003/0234432 | A1* | 12/2003 | Song et al. | 257/440 |
| 2004/0104412 | A1 | 6/2004 | Rhodes | 257/292 |
| 2004/0201072 | A1 | 10/2004 | Rhodes | 257/435 |
| 2004/0222481 | A1 | 11/2004 | Rhodes | 257/435 |
| 2005/0056901 | A1 | 3/2005 | Kuriyama | 257/428 |
| 2005/0067640 | A1 | 3/2005 | Ohkawa | 257/291 |
| 2005/0184322 | A1 | 8/2005 | Inoue | 257/292 |
| 2007/0018080 | A1 | 1/2007 | Inoue et al. | 250/214 |

FOREIGN PATENT DOCUMENTS

| CN | 1595657 A | 3/2005 |
|---|---|---|
| CN | 1802750 A | 7/2006 |
| JP | 03-116840 | 5/1991 |
| JP | 2000-124438 | 4/2000 |
| JP | 2005-086186 A | 3/2005 |

(Continued)

*Primary Examiner*—Andy Huynh
(74) *Attorney, Agent, or Firm*—Fitzpatrick, Cella, Harper & Scinto

(57) ABSTRACT

A solid-state image sensing device has a pixel that includes a photodiode that generates an electrical charge according to an amount of incoming light, a floating diffusion portion, a charge transfer transistor that transfers the electrical charge to the floating diffusion portion from the photoelectric conversion portion, a reading circuit that outputs an signal on the basis of said electrical charge held in said floating diffusion portion, and a light-shielding member disposed so as to cover a side wall of a gate electrode of the charge transfer transistor on the photoelectric conversion portion side.

11 Claims, 14 Drawing Sheets

FOREIGN PATENT DOCUMENTS

| | | |
|---|---|---|
| JP | 2005-101442 A | 4/2005 |
| JP | 2004-140152 A | 5/2005 |
| JP | 2006-523034 T | 5/2006 |
| KR | 2005-0122248 A | 12/2005 |
| TW | 244329 B | 11/2005 |
| WO | 2004-093439 A2 | 10/2004 |

* cited by examiner

SOLID-STATE IMAGE SENSING DEVICE

CROSS REFERENCE TO RELATED APPLICATION

This application is a division of U.S. application Ser. No. 11/448,020, filed on Jun. 7, 2006, the entire disclosure of which is hereby incorporated by reference herein.

FIELD OF THE INVENTION

The present invention relates to solid-state image sensing device, and more particularly, to a MOS-type solid-state image sensing device.

BACKGROUND OF THE INVENTION

In recent years, demand has increased rapidly for solid-state image sensing devices used as image sensing devices for image input mainly in digital still cameras and video cameras.

For these types of solid-state image sensing devices, CCD and MOS-type image sensors are widely used. The former are widely used as high picture quality image sensing devices due to their higher sensitivity and lower noise than the latter. On the other hand, however, CCDs have high power consumption and high drive voltages, and moreover, cannot be produced through the ordinary semiconductor manufacture process and are therefore expensive. Furthermore, a problem with CCDs is that it is difficult to integrate the drive circuitry and other peripheral circuits. By contrast, MOS-type image sensors can make up for the above-described deficiencies.

As a typical MOS-type solid-state image sensing device, a CMOS solid-state image sensing device has been commercialized. A circuit diagram of one pixel of a CMOS solid-state image sensing device is shown in FIG. 11, with a plan view thereof shown in FIG. 12 and a cross-sectional view shown in FIG. 13.

In FIG. 11, reference numeral 1 indicates a photodiode (PD), 2 indicates a transfer MOS transistor that transfers a charge from the photodiode and 3 indicates a floating diffusion (FD) portion that temporarily stores the transferred charge. Reference numeral 4 indicates a reset MOS transistor for resetting the FD portion 3 and the PD 1, 5 indicates a selection MOS transistor for selecting a given line from the pixel array of the solid-state image sensing device. Reference numeral 6 indicates a source follower MOS transistor that converts the charge accumulated in the FD portion 3 into voltage and amplifies it with a source follower-type amplifier, 7 indicates an output line, shared by all pixels in a given column, that reads out a voltage signal of each pixel, and 8 indicates a constant current source for setting the output line 7 at a constant current.

Next, a brief description is given of the operation of the CMOS solid-state image sensing device shown in FIG. 11. Incoming light is converted into an electrical charge by the PD 1 and the converted charge is transferred to the FD portion 3 by the transfer MOS transistor 2 and stored. The FD portion 3 and the PD 1 are reset to a set voltage in advance by turning on the reset MOS transistor 4 and the transfer MOS transistor 2, and therefore the voltage at the FD portion 3 changes according to the charge generated by the incoming light. The voltage at the FD portion 3 is amplified by the source follower MOS transistor 6 and output to the output line 7. The relevant pixels are selected by turning the selection MOS transistor 5 ON. The light signal portion charge is measured by calculating, at a reading circuit, not shown, the difference between the FD portion 3 reset voltage and the voltage after light signal accumulation.

FIG. 12 shows an example of the layout of the pixel circuit shown in FIG. 11. Reference numeral 10 indicates the active region where the PD 1 is formed and 11 indicates the active region where the selection MOS transistor 5 and the source follower MOS transistor 6 are formed. Reference numeral 20 indicates the transfer MOS transistor 2 region, 21 indicates a region enclosed by a dashed line indicating the gate line of the transfer MOS transistor 2, and 30 indicates a portion formed by a semiconductor PN junction of the FD portion 3. Reference numeral 31 indicates a contact for drawing out an electrode from the diffusion region of the FD portion 3 and 32 is a metal electrode for drawing out the FD portion 3. Reference numeral 34 indicates polysilicon that will become both the FD portion 3 electrode as well as the MOS transistor 6 gate electrode, and 33 is a contact for forming a connection from the metal electrode 32 to the polysilicon electrode 34.

Reference numeral 40 indicates the reset MOS transistor 4 region and 41 indicates a contact for connecting the reset MOS transistor 4 to a reset power source. Reference numeral 50 indicates the gate region of the selection MOS transistor 5 and 51 indicates a contact for connecting to a VDD power source, 60 indicates the source follower MOS transistor 6 region, with the polysilicon electrode 34 electrically connected to the FD portion 3 as the gate electrode. Reference numeral 70 indicates a signal output line composed of first layer wiring and formed of metal electrodes, and 71 indicates a contact for connecting the signal output line 70 and the source electrode of an area 60 of the source follower MOS transistor 6.

A cross-sectional view along the line CC' in the layout shown in FIG. 12 is shown in FIG. 13. Reference numeral 301 indicates an n-type silicon substrate, 302a indicates a p-type well, 302b indicates a p-type implantation layer, 303a indicates a transfer MOS transistor 2 gate oxidation film and 303b indicates a thin oxidation film on top of a light-receiving portion. Reference numeral 304 indicates the transfer MOS transistor 2 gate electrode, 305 indicates the PD 1 n-type cathode, and 306 indicates a surface p-type region for giving the PD 1 an implantation structure. Reference numeral 307a indicates a LOCOS oxidation film for element separation, 307b indicates a p-type channel stop layer, and 308 indicates a high-density n-type layer that forms the FD portion 3 and is also the transfer MOS transistor 2 drain region. In addition, reference numeral 309 indicates an interlayer insulation film that insulates the gate electrode 304 and the first metal layer 321 from each other, 320 indicates contact plugs, and 321 indicates the first metal layer which is an electrode for drawing out the FD portion 3. Reference numeral 322 indicates an interlayer insulation film that insulates the first metal layer 321 and a second metal layer 323 from each other, 323 indicates the second metal layer, 324 indicates an interlayer isolation film that insulates the second metal layer 323 and a third metal layer 325 from each other, 325 indicates the third metal layer, and 326 indicates a passivation film. In a color photoelectric conversion device, a color filter layer, not shown, and a microlens for improving sensitivity are further formed in a top layer of the passivation film 326.

Light incoming from the surface passes through an aperture without the third metal layer 325 and enters the PD 1. The light is absorbed by the PD 1 n-type cathode 305 or the p-type well 302a and electron-hole pairs are generated. The electrons are accumulated in the n-type cathode region.

However, with the conventional CMOS-type solid-state image sensing device described above, signal electrons generated in response to incoming light causes the output voltage to fluctuate. Of an electron-hole pair 330b generated beneath the transfer MOS transistor 2 gate electrode 304 in response to inclined incoming light 330a striking at an angle as shown in FIG. 13, the electron is attracted to the high-density n-type layer 308 that forms the FD portion 3 rather than the PD-1 n-type cathode 305.

Furthermore, light 331a striking the top of the transfer MOS transistor 2 gate electrode 304 is repeatedly reflected as shown in FIG. 13, and an electron-hole pair 331b is generated beneath the high-density n-type layer 308. The electron of this pair is attracted to the high-density n-type layer 308. If the first metal layer 321 is extended toward the aperture side to improve light shielding in order to prevent this from happening, the static capacitance of the FD portion 3 increases and the charge conversion coefficient decreases, resulting in deterioration of the S/N ratio.

Electrons that are captured directly by the FD portion 3 without passing through the PD 1 as described above become pseudo signals, increasing the noise of the solid-state image sensing device, reducing its dynamic range, increasing its dark signal, increasing its dark shading and so forth. Particularly when all the charges are transferred from the PD 1 to the FD portion 3 simultaneously and those charges are output in sequence to the signal line in a so-called electronic shutter operation, the longer the charges are held in the FD portion 3 the more the pseudo signals overlap, thereby causing phenomena known as shading and S/N ratio intraframe distribution to occur. For this reason, a way has long been sought of improving the light-shielding capability of conventional CMOS solid-state image sensing devices.

With CCD-type solid-state image sensing devices as well, usually a source follower-type amplifier circuit using floating diffusion is used on the final stage of the reading circuit. Japanese Patent Application Laid-Open No. 03-116840 shows an example using polysilicon for drawing of the electrode to the source follower amplifier. However, there is no mention of improving the light-shielding capability of the device in the invention described in Japanese Patent Application Laid-Open No. 03-116840, nor is there any consideration given to the flow of the electrons generated inside the silicon to the floating diffusion portion as shown in the conventional examples described above. Furthermore, with a CCD solid-state image sensing device, there is only one floating diffusion amplifier circuit in the later stage of a horizontal CCD, thus permitting to arrange the floating diffusion amplifier circuit far from the pixel portion and not restricted by the pixel surface area and thereby eliminating the need for additional engineering.

By contrast, with MOS-type solid-state image sensing devices there is a floating diffusion portion at every pixel, and thus the photodiode and the floating diffusion portions are close to each other. In addition, the metal electrode that functions as a light shield is also used as circuit wiring, and therefore a gap must be provided and the like. Therefore the situation is different from that of a CCD-type solid-state image sensing device, and requires more structural engineering.

A method for strengthening the light shielding of the floating diffusion portion in a MOS-type solid-state image sensing device is shown in Japanese Patent Application Laid-Open No. 2000-124438, and FIG. 14 is a diagram showing a cross-sectional view of the structure of the invention described therein. As shown in FIG. 14, a cylindrical light-shielding member 1009 is disposed atop the photodiode so as to cover the aperture portion.

However, although the structure described in Japanese Patent Application Laid-Open No. 2000-124438 can shield an area except for the aperture from light, it does so at the cost of performing the extremely difficult process of leaving the light-shielding member only at the side surfaces of fine pixels. Moreover, a latitudinal margin is also required to insulate the light-shielding member from a first layer wiring 1006 and a second layer wiring 1007. Consequently, the actual aperture is extremely narrow, which reduces sensitivity and is thus not a practical solution.

SUMMARY OF THE INVENTION

The present invention has been made in light of the above-described situation, and has as its object to improve the light-shielding capability of the floating diffusion portion of a MOS-type solid-state image sensing device.

According to the present invention, the foregoing object is attained by providing a solid-state image sensing device having a pixel comprising: a photoelectric conversion portion that generates an electrical charge according to an amount of incoming light; a floating diffusion portion; a charge transfer transistor that transfers the electrical charge to the floating diffusion portion from the photoelectric conversion portion; a reading circuit that outputs an signal on the basis of the electrical charge held in the floating diffusion portion; and a light-shielding member disposed so as to cover a side wall of a gate electrode of the charge transfer transistor on the photoelectric conversion portion side.

Other features and advantages of the present invention will be apparent from the following description when taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings. However, the dimensions, shapes and relative positions of the constituent parts shown in the embodiments should be changed as convenient depending on various conditions and on the structure of the apparatus adapted to the invention, and the invention is not limited to the embodiments described herein.

Figure 1:
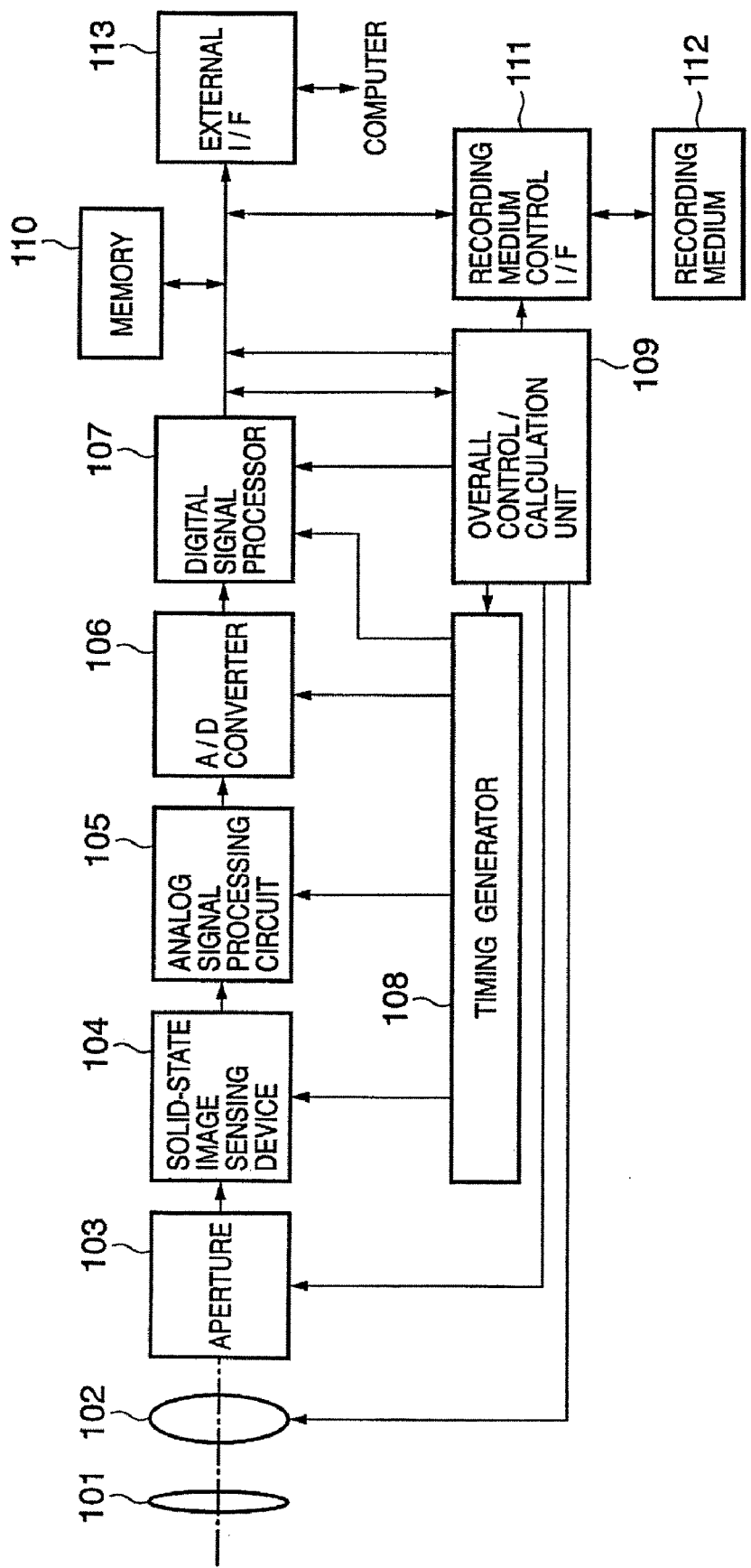
FIG. 1 is a block diagram showing the structure of a camera system using a MOS-type solid-state image sensing device according to an embodiment of the present invention.

FIG. 1 is a block diagram showing the structure of a digital camera using a solid-state image sensing device according to an embodiment of the present invention. In FIG. 1, reference numeral 101 indicates a shutter and 102 represents an image sensing lens. The shutter 101 is positioned in front of the image sensing lens 102 and controls exposure. Light passes through the shutter 101 and the image sensing lens 102, and the amount of light is adjusted as necessary by an aperture 103 and focused on a solid-state image sensing device 104. Electrical signals output from the solid-state image sensing device 104 according to the amount of incident light are processed by an analog signal processing circuit 105 and then converted from analog signals into digital signals by an A/D converter 106. The converted digital signals are then further processed by a digital signal processor 107, after which they are stored in a memory 110 or output to an external device through an external I/F 113.

The processing timing of the solid-state image sensing device 104, the analog signal processing circuit 105, the A/D converter 106 and the digital signal processor 107 are controlled by a timing generator 108, and the system as a whole is controlled by an overall control/calculation unit 109. It should be noted that if the digital signals output from the A/D converter 106 are recorded to a recording medium 112, they are recorded through a recording medium control I/F 111 that is controlled by the overall control/calculation unit 109.

Figure 2:
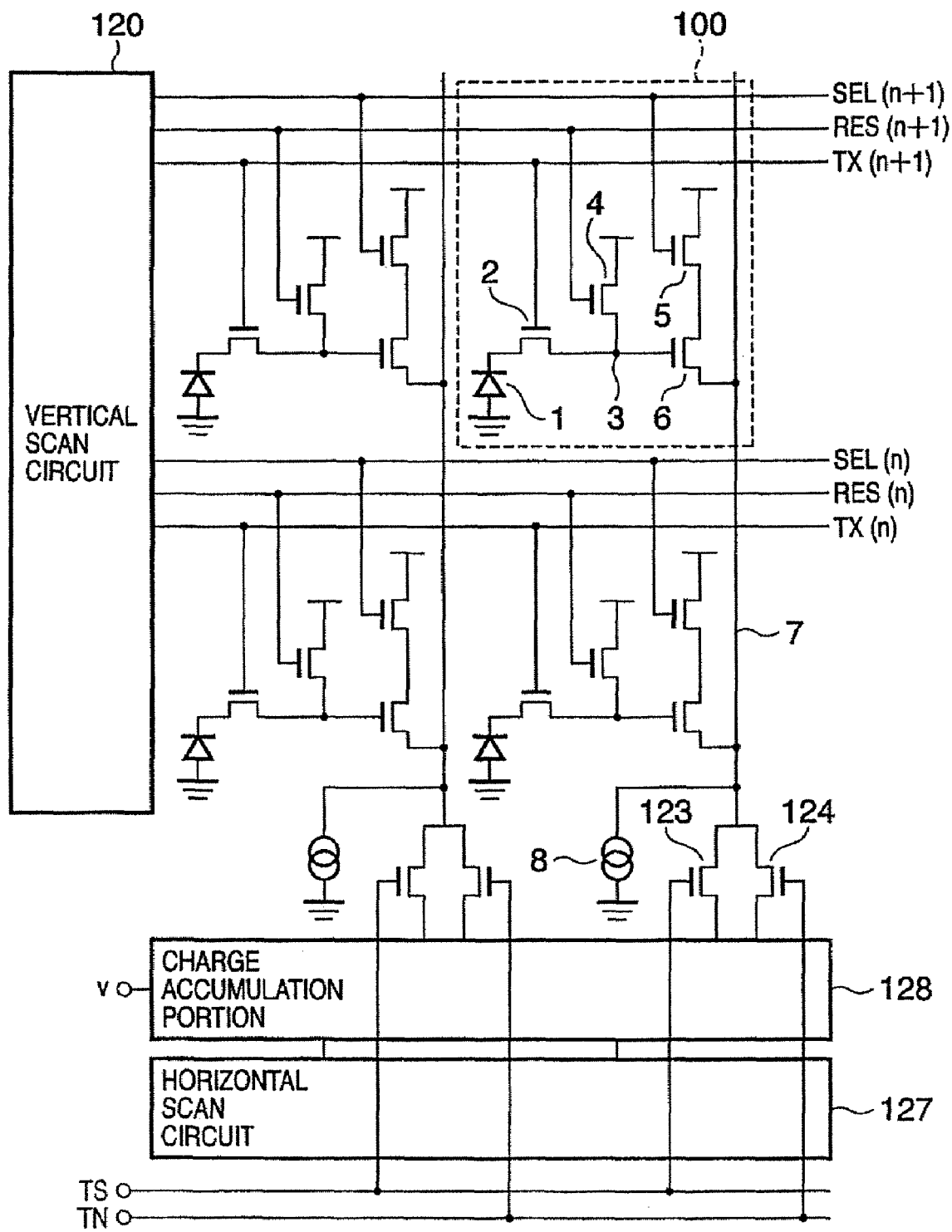
FIG. 2 is a diagram showing an example of a partial circuit diagram of an MOS-type solid-state image sensing device according to the embodiment of the present invention.
Figure 11:
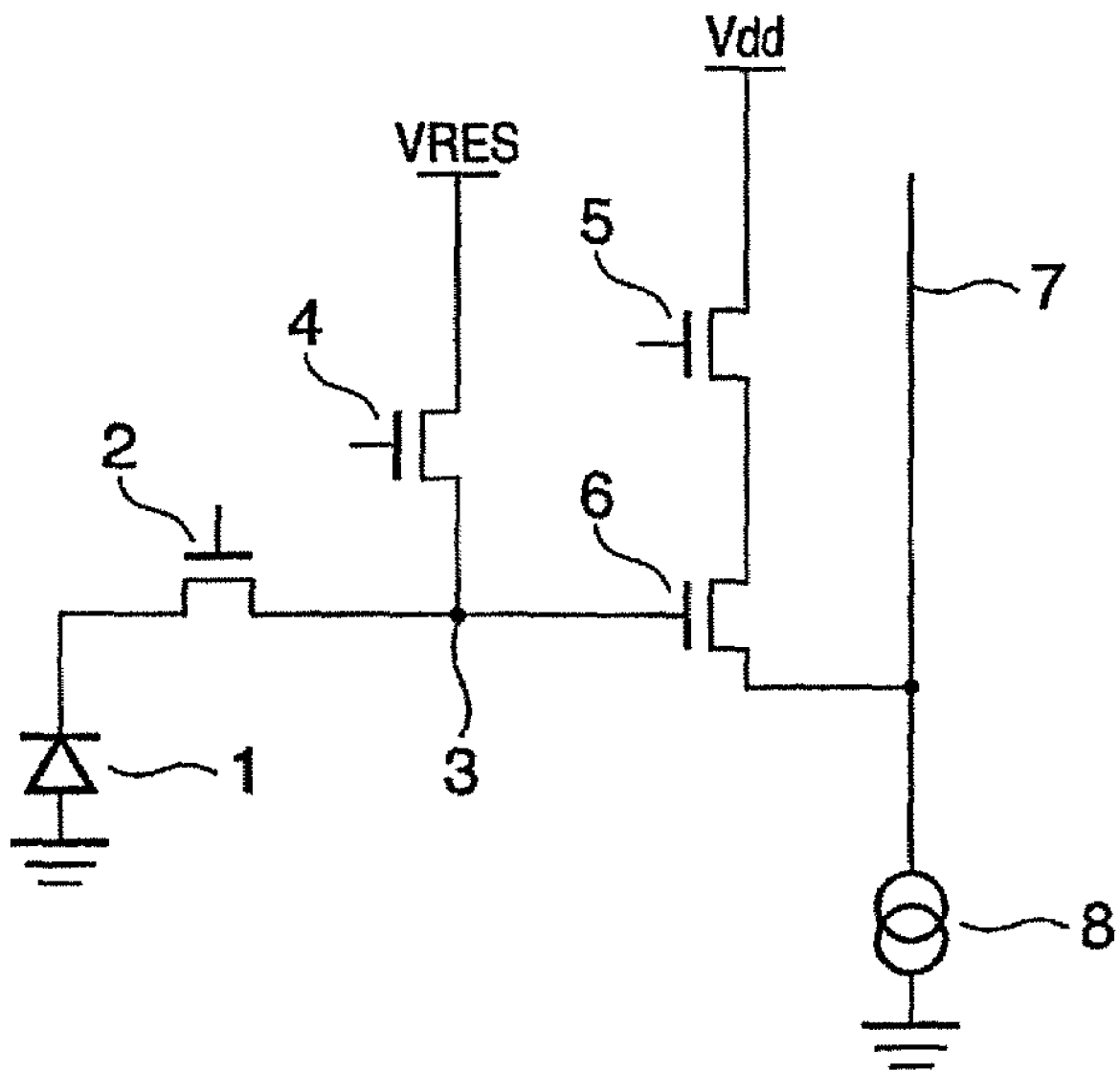
FIG. 11 is a diagram showing a pixel circuit of a conventional MOS-type solid-state image sensing device.

Next, a description is given of the general structure of the solid-state image sensing device 104 shown in FIG. 1, with reference to FIG. 2. FIG. 2 shows a portion of an image sensing device that uses NMOS transistors for the transistors that form the pixels as the solid-state image sensing device 104. As shown in FIG. 2, pixels having the same structure as in the conventional example described using FIG. 11 are arrayed in two dimensions. For ease of explanation, FIG. 2 shows only 4 pixels arranged in a 2×2 matrix configuration, but it should be noted that in actuality several hundred thousand to several million pixels are arrayed two-dimensionally. In addition, it is also possible to use PMOS transistors.

Each pixel 100 comprises a PD 1, a transfer MOS transistor 2, a FD portion 3, a reset MOS transistor 4, a selection MOS transistor 5, and a source follower MOS transistor 6. The gates of all selection MOS transistors 5 of the same line are connected to a selection line SEL (i), the gates of all reset MOS transistors 4 of the same line are connected to a reset line RES (i), and the gates of all transfer MOS transistors 5 are connected to a transfer line TX (i). The pixels are scanned and selected by a vertical scan circuit 120. Current sources 8 are connected to output lines 7 of the respective columns, such that the electric potentials of the output lines 7 can be read out by the operation of the source follower.

Reference numeral 123 indicates a light signal transfer MOS transistor, the gate of which is connected to a light signal output line TS. The gate is turned ON through the light signal output line TS when a light signal appears on the output line 7, transferring the light signal on the output line 7 to a charge accumulation portion 128. Reference numeral 124 indicates a noise signal transfer MOS transistor, the gate of which is connected to a noise signal output line TN. After the pixels 100 are reset and before a light signal appears on the output line 121, the signal (noise) on the output line 7 is transferred to the charge accumulation portion 128. The light signal and the noise signal stored in the charge accumulation portion 128 are scanned and read out in sequence by the horizontal scan circuit 127 and the difference between the light signal and the noise signal is obtained and output by a differential amplifier circuit, not shown.

It should be noted that, in the circuit shown in FIG. 2, in addition to the PD 1, the transfer MOS transistor 2 and the source follower MOS transistor 6, the selection MOS transistor 5, the reset MOS transistor 4 and the like are described. Of these, the reset MOS transistor 4 and the selection MOS transistor 5 may be composed of a single transistor. Alternatively, at least one of the source follower MOS transistor 6, the selection MOS transistor 5 and the reset MOS transistor 4 may be shared by multiple pixels. In the circuit shown in FIG. 2, a reading circuit comprises the source follower MOS transistor 6, the selection MOS transistor 5.

Figure 3:
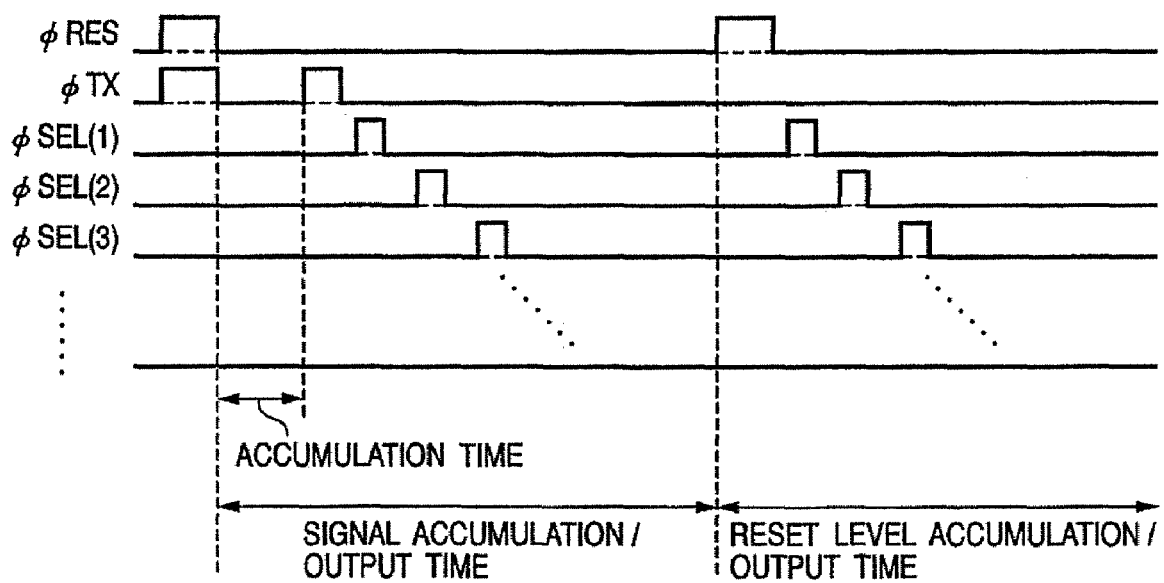
FIG. 3 is a timing chart for control of an operation that accumulates charges at all pixels simultaneously according to the embodiment of the present invention.

Next, a description is given of control of the operation of charging all pixels simultaneously in the solid-state image sensing device 104 having the structure shown in FIG. 2, with reference to the timing chart shown in FIG. 3. It should be noted that, in FIG. 3, signals applied to the signal lines shown in FIG. 2 are indicated using "Φ".

First, in order to reset the PD 1 of all the pixels, reset pulses ΦRES for all lines and transfer pulses ΦTX for all lines are turned ON simultaneously. From the moment both pulses are turned OFF, photoelectric conversion is carried out simultaneously across the entire image sensing surface and charge accumulation begins. After accumulation is carried out for a desired time only, the transfer pulses ΦTX for all lines are turned ON and then OFF again, transferring the signal charges for the pixels all at once to the FD portions 3 of the pixels. Then, by sequentially turning the selection pulse ON/OFF by line, signals corresponding to the charges transferred to the FD portions 3 are read out in sequence by line. The signals output here are "S+N" signals composed of light signals and noise signals, are accumulated in the charge accumulation portion 128, and are output in sequence in response to the operation of the horizontal scan circuit 127. When the charges accumulated in the pixels of all lines are read out, the signal accumulation/signal output time period ends.

Next, the reset pulses for all lines are turned ON, resetting the FD portions 3 of all the pixels all at once. After the reset pulses are turned OFF, the potentials at the FD portions 3 are output in sequence by line. The output signals are noise signals, and are accumulated in a capacitor consolidated with a capacitor for "S+N" signals in the charge accumulation portion 128 as "N" signals. The accumulated "S+N" signals and "N" signals are input to a differential amplifier, not shown, to extract the "S" signal.

In the above-described operation, the length of time the charges are held in the FD portions 3 is different at each line, and therefore, in the conventional structure, the line with a long holding time (in this case, the last line) compared to the line with the short holding time (in this case, the first line) experiences a shading of the output voltage due to the irruption of the pseudo signal. In the present embodiment, the pseudo signal enters the FD portion 3 but is restricted, and therefore such shading either is not present at all or is present at so low a level as to be not a problem.

First Embodiment

A detailed description will now be given of the structure of the pixels of a solid-state image sensing device according to a first embodiment of the present invention, used in an image sensing device and the like having the structure described above.

Figure 4:
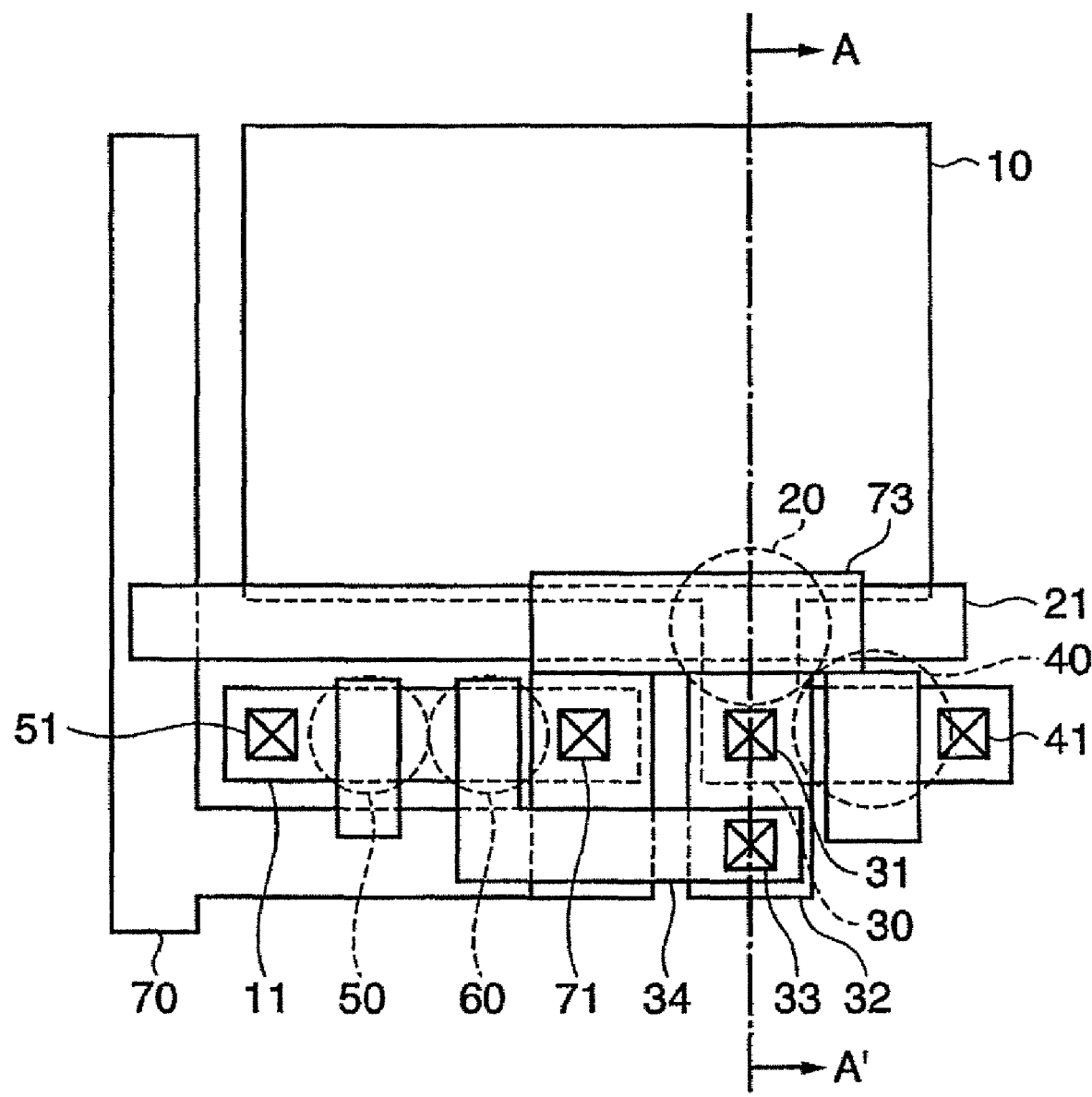
FIG. 4 is a diagram showing the layout of a pixel of a MOS-type solid-state image sensing device according to a first embodiment of the present invention.
Figure 12:
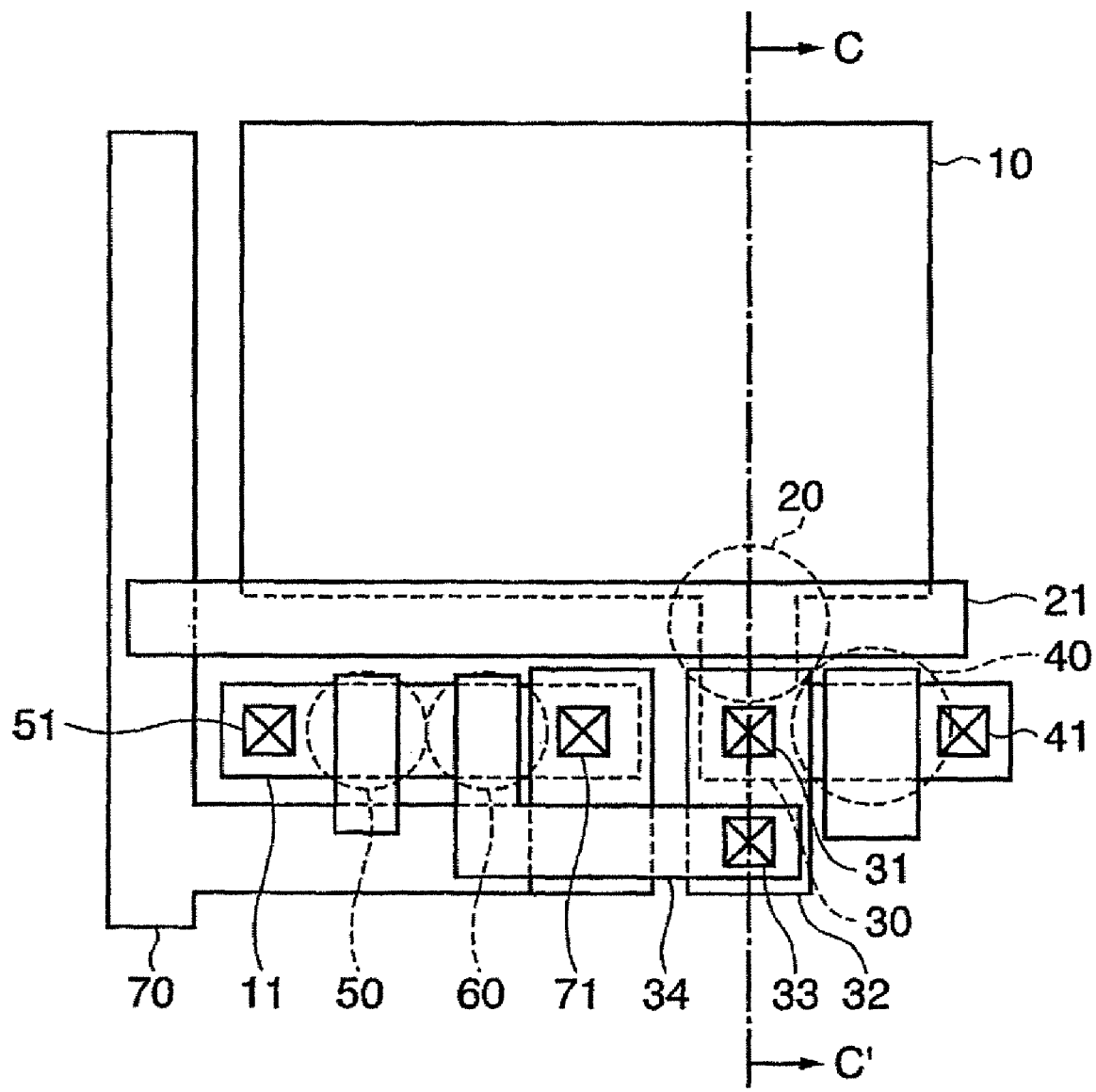
FIG. 12 is a diagram showing an example of the layout of a pixel of a conventional MOS-type solid-state image sensing device.

FIG. 4 is a diagram showing the layout of a pixel circuit of a first embodiment of the present invention. It should be noted that elements that are identical to those shown in FIG. 12 are assigned the same reference characters and a description thereof is omitted.

In FIG. 4, reference numeral 73 indicates a light-shielding member of the gate electrode of the transfer MOS transistor 2. The light-shielding member 73 shields the polysilicon of the gate electrode of the transfer MOS transistor 2 so as to cover the polysilicon 21 with respect to the direction of the length of the channel, and is slightly larger than the width of the channel so as to prevent incoming light from entering directly beneath the FD portion 3. Below, the length of the extension of the light-shielding film from the gate electrode in the direction of the length of the channel and the length of the extension of the light film in the direction of the width of the channel are explained.

In the channel length direction, the PD portion and the FD portion are disposed, and, where the extension of the light-shielding film toward the PD portion side is great, the PD aperture ratio declines. On the other hand, where the extension of the light-shielding film toward the FD portion side is great, it is difficult to form contacts from the FD portion. By contrast, the channel width portion allows a greater degree of design freedom than the channel length direction. Therefore, it is preferable that the length of the extension in the channel width direction be greater than that in the channel length direction.

Figure 5:
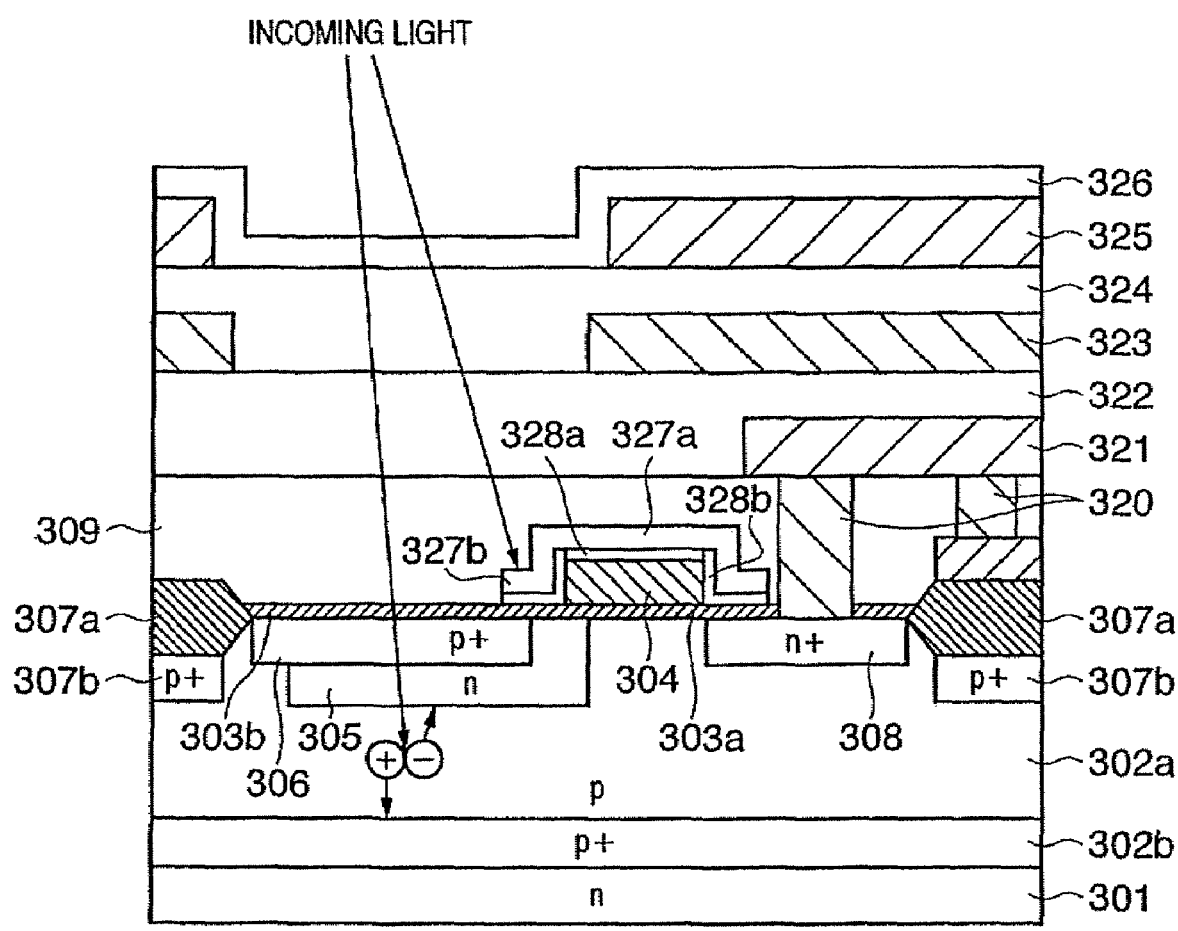
FIG. 5 is a cross-sectional diagram showing an example of a pixel of the MOS-type solid-state image sensing device according to the first embodiment of the present invention.
Figure 13:
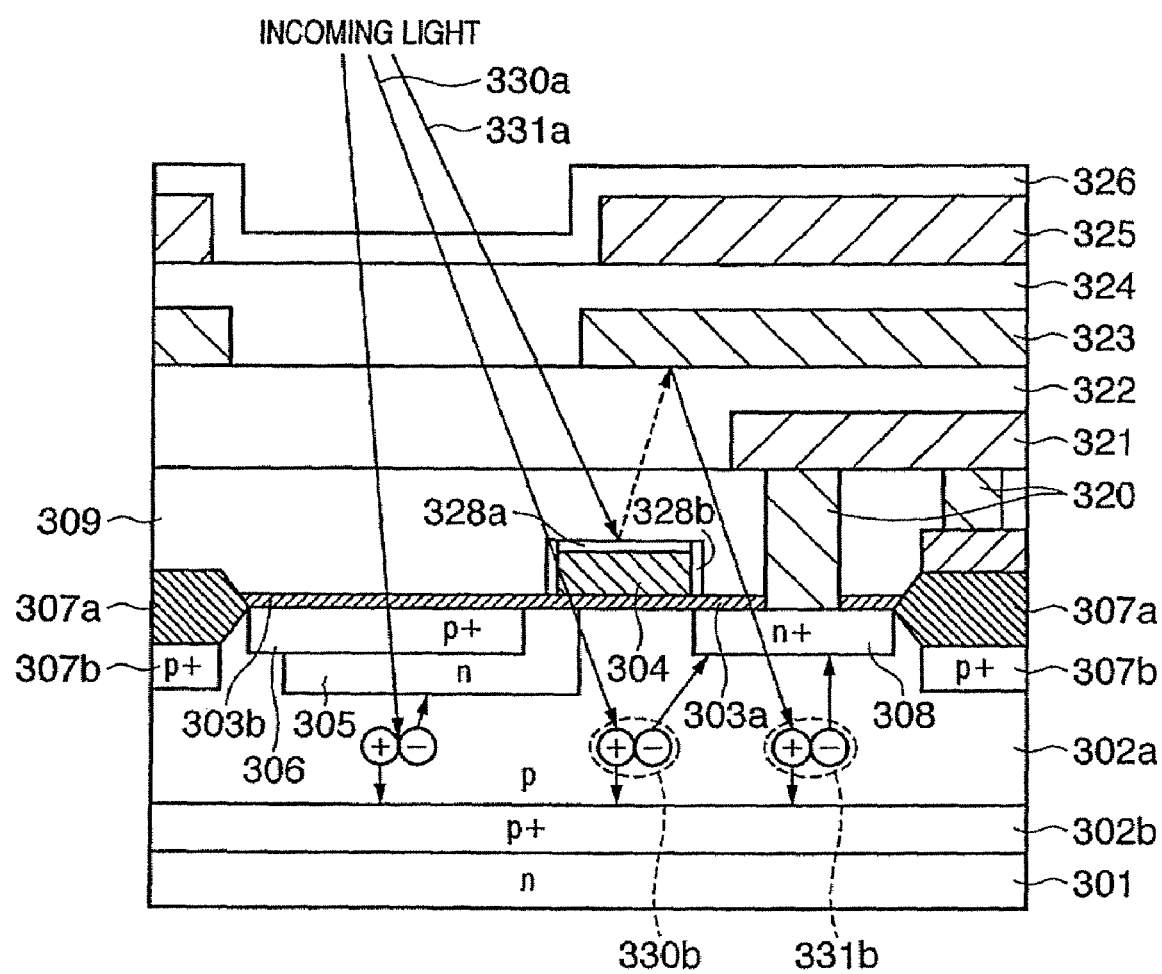
FIG. 13 is a cross-sectional diagram showing an example of a pixel of a conventional MOS-type solid-state image sensing device.
Figure 14:
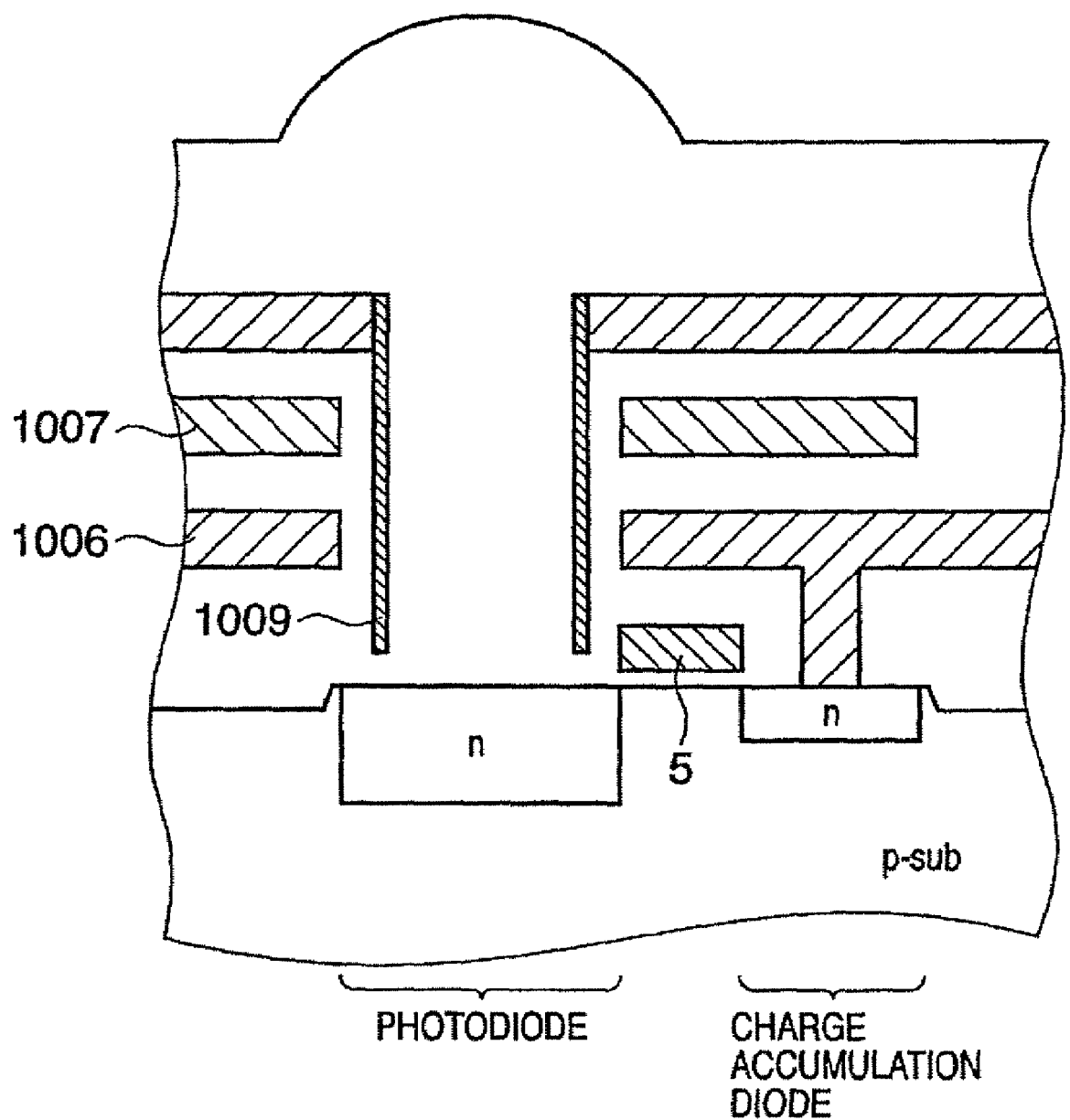
FIG. 14 is a cross-sectional diagram showing another example of a pixel of a conventional MOS-type solid-state image sensing device.

FIG. 5 is a diagram showing a cross-sectional view of the pixel of the solid-state image sensing device 104 along a line AA' shown in FIG. 4. It should be noted that elements that are identical to those shown in FIG. 13 are given the same reference characters and a description thereof is omitted.

The distinctive feature of the present embodiment is that light-shielding members 327a, 327b are disposed so as to cover the gate electrode 304 through thin silicon oxide films 328a, 328b. It is preferable that the light-shielding members 327a, 327b be made of a film that is thinner than the polysilicon that forms the gate electrode 304, but it is necessary that the thin film be thick enough to block light. Furthermore, it is preferable that the light-shielding members 327a, 327b be made of a material that does not reflect light. Suitable materials include tungsten, tungsten alloy, titanium, titanium alloy, tantalum, tantalum alloy, molybdenum, molybdenum alloy and the like. Of these, tungsten has the best light-shielding capability, material stability and workability. It is also possible to use a silicide composed of these materials and the polysilicon that forms the gate electrode. As shown in FIG. 5, the light-shielding member 327a is disposed so as to cover the side wall of the gate electrode on the FD portion side.

Of the light entering from the surface of the pixel, light in the vicinity of the gate electrode 304 of the transfer MOS transistor 2 is blocked by the light-shielding members 327a, 327b, and therefore generation of charge in the vicinity of the FD portion 3 (the high-density n-type layer 308) is restrained.

Thus, as described above, the first embodiment enables the light-shielding capability of the FD portion 3 to be improved by providing light-shielding members 327a, 327b on the gate electrode 304 of the transfer MOS transistor 2, enabling the effects of the pseudo signals to be removed. In addition, because it enables the dynamic range and the S/N ratio to be improved without dark shading, the first embodiment enables images of high picture quality to be obtained even when outputting images using electronic shutter control, in which all pixels are charged simultaneously.

Next, a description is given of the production process from after formation of the gate electrode 304 up to and including formation of the silicon oxide film 309.

After the gate electrode 304 is formed, the gate electrode 304 is oxidized in an atmosphere of oxidizing gas and covered with a thin insulating film. Then, after the light-shielding member is grown over the entire surface by CVD (Chemical Vapor Deposition) or by sputtering, the light-shielding member is retained only at desired locations by patterning. In the case of tungsten, preferably, the thickness of the film is 50 nm-250 nm. If the film is too thin it loses its light-shielding capability, and if the film is too thick the amount of light reaching the photodiode decreases, reducing sensitivity. In addition, the CVD method is preferable to the sputtering method for good coverage of the side wall portions as shown in FIG. 5. Then, the silicon oxide film 309 is laid down by CVD. After a film of sufficient thickness is accumulated, the top surface is flattened by CMP (Chemical Mechanical Polishing). BPSG (Boron-Phosphorus-Silicate-Glass) having hot reflow capability may be used for the silicon oxide film 309. In that case, the BPSG is heated to 850° C. or higher after CVD and reflowed, after which the top surface is polished by CMP. Reflowing facilitates achieving a flat top surface to the silicon insulation film by CMP.

As can be understood by those of ordinary skill in the art, the present invention is also applicable to an image sensing device in which hole-accumulation type pixels are created by inverting the electrical conductivity of all the constituent structures.

Second Embodiment

Figure 6:
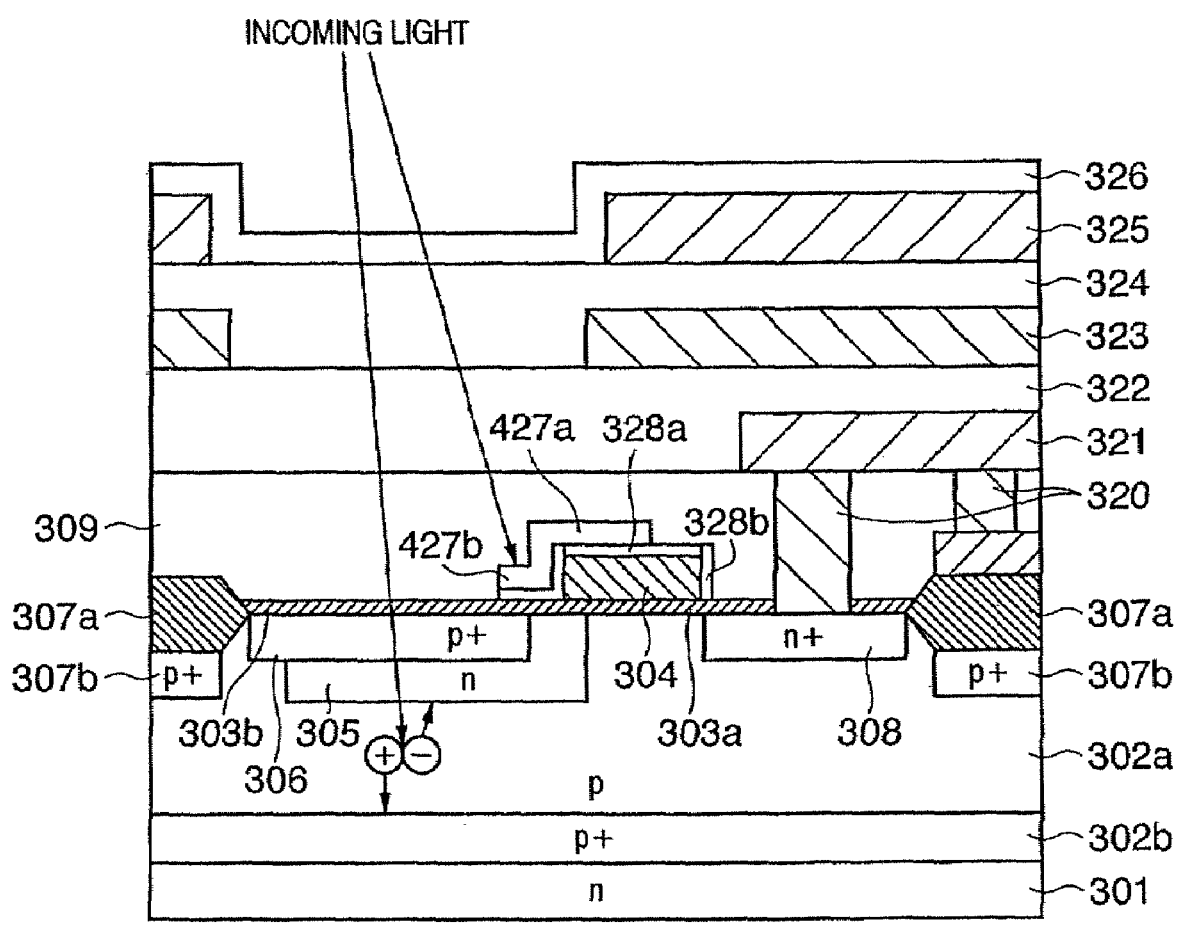
FIG. 6 is a cross-sectional diagram showing an example of a pixel of a MOS-type solid-state image sensing device according to a second embodiment of the present invention.

FIG. 6 is a diagram showing an example of a pixel of a MOS-type solid-state image sensing device according to a second embodiment of the present invention, viewed in cross-section. In FIG. 6, elements that are identical to those of the first embodiment described above using FIG. 5 are assigned the same reference characters and a description thereof is omitted.

As shown in FIG. 6, the shapes of light-shielding members 427a, 427b of the second embodiment are different from the shapes of the light-shielding members 327a, 327b of the first embodiment shown in FIG. 5. In this second embodiment as well, the light-shielding members 427a, 427b are disposed so as to cover the top of the gate electrode 304 through thin the silicon oxide films 328a, 328b. However, although the side and the top of the side of the gate electrode 304 that faces the PD 1 is covered by the light-shielding members 427a, 427b, the top and the side of the side that faces the FD portion 3 is not covered by a light-shielding member. This arrangement stems from the fact that the side that requires the light-shielding member is the PD 1 side where light enters, and from the fact that, so long as it is necessary for the FD portion 3 to draw an electrode, it is desirable that the gate electrode 304 not be covered.

Thus, as described above, providing light-shielding members arranged laterally asymmetrically with respect to a direction in the length of the channel of the transfer MOS transistor 2 enables the present invention to provide a light-shielding member structure suitable for smaller pixels.

It should be noted that in the present embodiment the top and the side surfaces of the gate electrode 304 on the side of the PD 1 are covered with light-shielding members. However, a substantial light-shielding effect can still be obtained even where only the side surface of the gate electrode 304 facing the PD 1 is covered.

Third Embodiment

Figure 7:
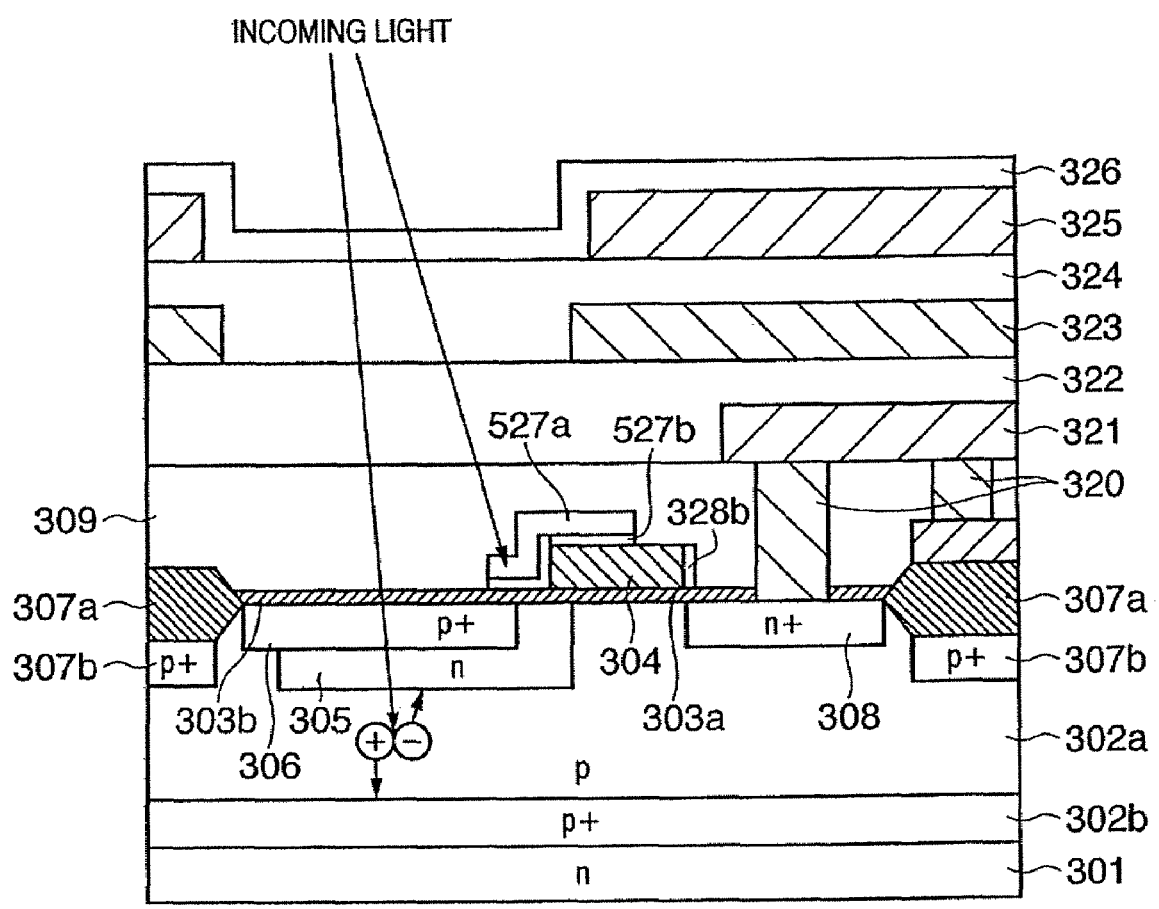
FIG. 7 is a cross-sectional diagram showing an example of a pixel of a MOS-type solid-state image sensing device according to a third embodiment of the present invention.

FIG. 7 is a diagram showing an example of a pixel of a MOS-type solid-state image sensing device according to a third embodiment of the present invention, viewed in cross-section. In FIG. 7, elements that are identical to those of the first embodiment described above using FIG. 5 are assigned the same reference characters and a description thereof is omitted.

In the third embodiment, there is no thin silicon oxide film 328a covering the top of the gate electrode 304 as shown in FIG. 6 in the asymmetrical light-shielding members 427a, 427b of the second embodiment. In addition, shown in the diagram is an example in which the gate electrode 304 and the light-shielding members 527a, 527b contact each other directly along the top and the side of the gate electrode 304.

With the third embodiment, as shown in FIG. 7 the light-shielding members 527a, 527b are made of two layers of metal, with a barrier metal used for one layer 527b directly contacting the gate electrode 304. The barrier metal is capable of preventing the metal atoms of another layer 527a from diffusing into the polysilicon of the gate electrode 304. Where tungsten is used in one example of the light-shielding member 527a, titanium silicide or layers of titanium silicide and titanium are suitable for the barrier metal 527b.

By "lining" the polysilicon with metal as described above, the resistance of the polysilicon can be reduced dramatically. As the width of the gate line decreases as the number of pixels per line increases and the size of the pixels decreases, the transfer MOS transistor 2 gate delay causes the signal output time from the pixels to increase. For that reason, reducing the resistance makes it possible to provide an image sensing device that operates at high speed even with smaller pixels.

Moreover, the barrier metal prevents the heavy metal used for the light-shielding member 527a from diffusing into the polysilicon gate electrode 304 with heat treatment, thereby preventing a reduction in resistance from affecting the transfer transistor work coefficient as well as preventing an increase in point defects due to the intrusion of diffused heavy metal into the silicon through the gate insulation film.

Fourth Embodiment

Figure 8:
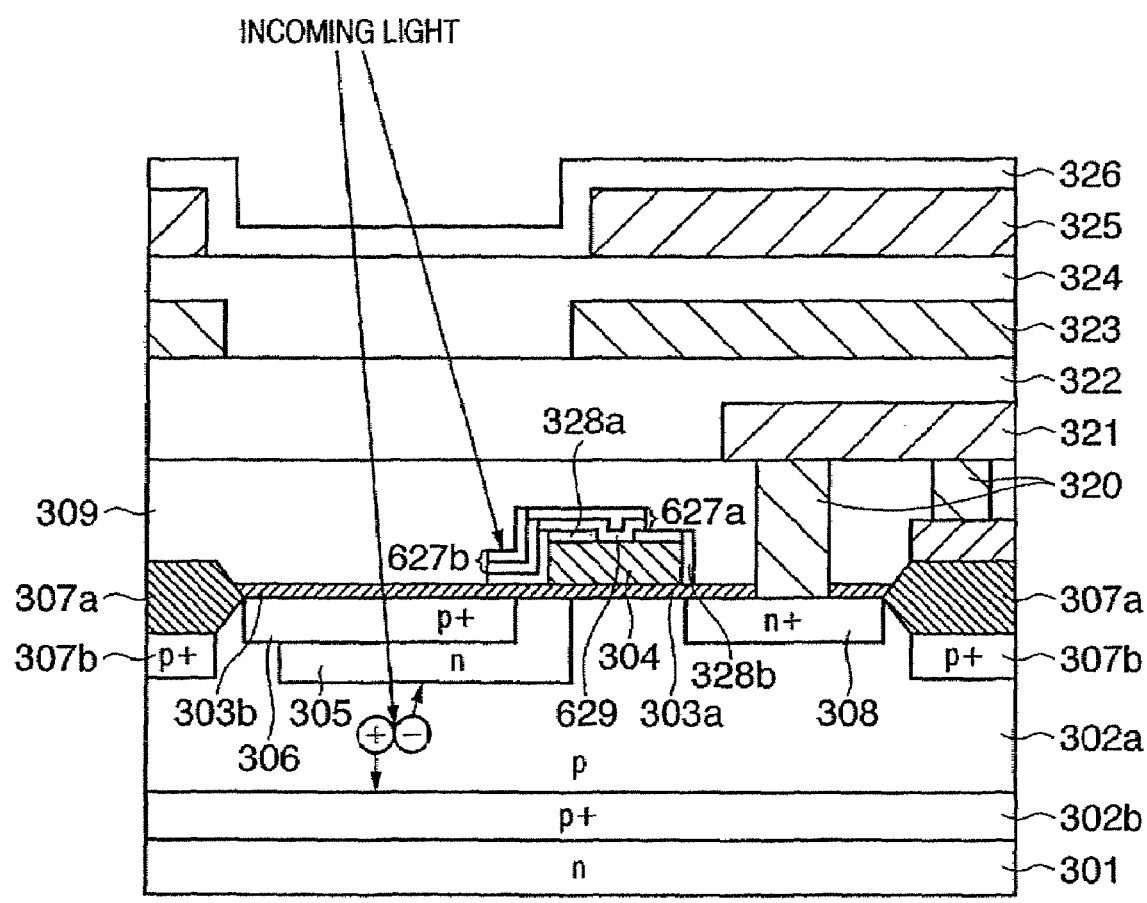
FIG. 8 is a cross-sectional diagram showing an example of a pixel of a MOS-type solid-state image sensing device according to a fourth embodiment of the present invention.

FIG. 8 is a diagram showing an example of a pixel of a MOS-type solid-state image sensing device according to a fourth embodiment of the present invention, viewed in cross-section. In FIG. 8, elements that are identical to those of the first embodiment described above using FIG. 5 are assigned the same reference characters and a description thereof is omitted.

In the fourth embodiment, the thin silicon oxide film 328 is provided between light-shielding members 627a, 627b composed of two layers of metal and the gate electrode 304, and a contact hole 629 is formed in the silicon oxide film 328. The fourth embodiment differs from the third embodiment described above in that the light-shielding members 627a, 627b are connected to the gate electrode 304 through the contact hole 629.

Figure 9:
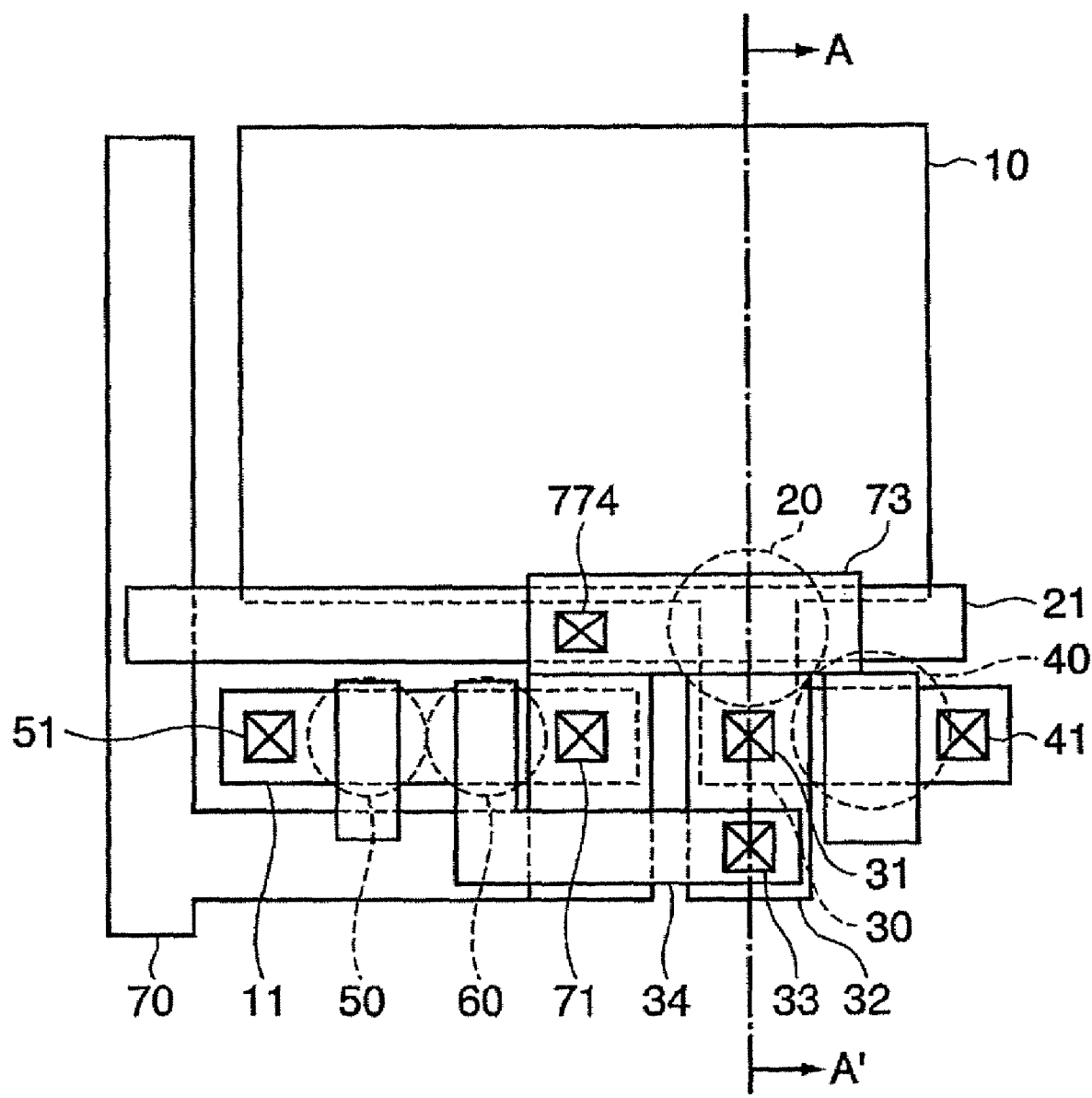
FIG. 9 is a diagram showing the layout of a pixel of the MOS-type solid-state image sensing device according to the fourth embodiment of the present invention.

A plan view of the layout of the fourth embodiment is shown in FIG. 9. In FIG. 9, elements identical to those shown in FIG. 4 are assigned the same reference characters. In FIG. 9, a contact hole 774 opens onto a field oxidation film.

By not effecting the connection between the gate electrode 304 composed of polysilicon and the light-shielding member 627a on the active region as in this fourth embodiment, any change in the threshold value of the transfer MOS transistor 2 due to the diffusion of heavy metal can be held to a minimum even without a barrier metal. However, where the contact hole 774 and the active region cannot be separated because of the smallness of the pixel, it is desirable to lay down barrier metal beneath the light-shielding member 627a as in the fourth embodiment.

According to the fourth embodiment as described above, in addition to attaining the same effect as is achieved with the third embodiment described above, the present embodiment also enables the diffusion of the heavy metal of the light-shielding member to the semiconductor substrate to be minimized.

Fifth Embodiment

Figure 10:
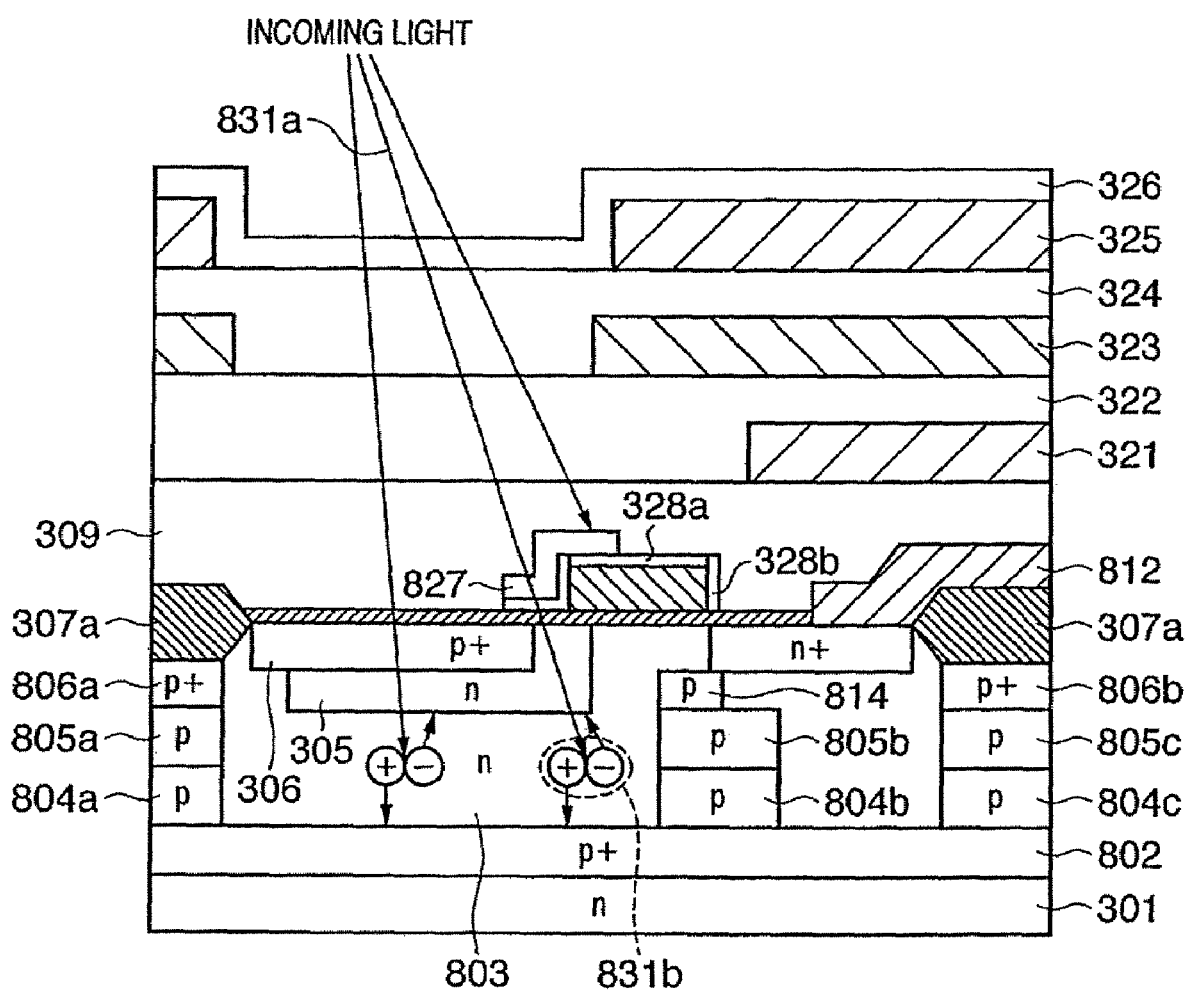
FIG. 10 is a cross-sectional diagram showing an example of a pixel of a MOS-type solid-state image sensing device according to a fifth embodiment of the present invention.

FIG. 10 is a diagram showing an example of a pixel of a MOS-type solid-state image sensing device according to a fifth embodiment of the present invention. In FIG. 10, elements that are identical to those of the first embodiment described above using FIG. 5 are assigned the same reference characters and a description thereof is omitted.

In the present embodiment, the gate electrode of the transfer MOS transistor 2 is shielded from the light by a light-shielding member 827 and a potential barrier is provided in the silicon so that charges generated in the area beneath the transfer MOS transistor 2 are not diffused to the FD portion 3. At the same time, the drawing out of the electrode from the FD portion 3 is accomplished by drawing out directly from the polysilicon so that the top of the FD portion 3 is shielded from the light by the first metal layer, thus making it possible to provide a structure with a comprehensively enhanced light-shielding capability for the FD portion 3.

In FIG. 10, reference numeral 802 indicates a high-density p-type implantation layer, 803 indicates an n-type epitaxial layer, 804a, 804b and 804c indicate a p-type separation layer, and 805a, 805b and 805c indicate a p-type well layer. In addition, reference numerals 806a and 806b indicate a channel stop p-type layer below a field oxidation film. Reference numeral 814 indicates a field stop layer for stipulating a charge transfer path from the PD 1 to the FD portion 3 and forming a potential barrier directly beneath the transfer MOS transistor 2, 812 indicates a polysilicon drawn electrode that directly contacts a high-density n-type region and 827 indicates the light-shielding member.

With the fifth embodiment, the side wall of the gate electrode 304 of the transfer MOS transistor 2 on the PD 1 side and a portion of the top surface of the PD 1 are shielded from light, and a p-type separation layer 804b, a p-type well layer 805b and a field stop layer 814 are provided. Such a structure causes an electron of an electron-hole pair 831b generated at the edge of the PD 1 by inclined incoming light 831*a* to collect at the PD 1 n-type cathode 305 without diffusion to the FD portion 3 side.

Thus, as described above, the fifth embodiment enables diffusion from the interior of the silicon to the FD portion 3 to be reduced, and thus the present embodiment enables the pseudo signals to be removed more effectively by a combination of a light-shielding member and a potential barrier.

As many apparently widely different embodiments of the present invention can be made without departing from the spirit and scope thereof, it is to be understood that the invention is not limited to the specific embodiments thereof except as defined in the appended claims.

This application claims the benefit of Japanese Patent Application No. 2005-171659 filed on Jun. 10, 2005, which is hereby incorporated by reference herein in its entirety.

What is claimed is:

1. A solid-state image sensing device comprising:
   a photoelectric conversion portion that generates electrical carriers according to an amount of incoming light;
   a charge storage portion storing the electrical carriers;
   a gate electrode, forming a MOS transistor together with the photoelectric conversion portion and the charge storage portion, that transfers the electrical carriers to the charge storage portion from the photoelectric conversion portion;
   a reading circuit that outputs a signal based on the electrical carriers held in the charge storage portion; and
   a light-shielding member disposed so as to cover a side wall of the gate electrode of the MOS transistor on a side corresponding to the photoelectric conversion portion while a side wall of the gate electrode of the MOS transistor on a side corresponding to the charge storage portion is not covered by the light-shielding member.

2. The solid-state image sensing device according to claim 1, wherein
   the photoelectric conversion portion is included among a plurality of photoelectric conversion portions of the device,
   the charge storage portion is included among a plurality of charge storage portions of the device, each charge storage portion making a pair with a respective one of the plurality of photoelectric conversion portions, and
   electrical carriers from the plurality of photoelectric conversion portions are simultaneously transferred to the plurality of respective charge storage portions.

3. The solid-state image sensing device according to claim 1, wherein the reading circuit includes a source follower MOS transistor.

4. The solid-state image sensing device according to claim 3, wherein the source follower MOS transistor is a p-type MOS transistor.

5. The solid-state image sensing device according to claim 1, further comprising a capacitor that stores a signal based on the electrical carriers that are outputted by the reading circuit and a signal superimposed on the signal based on the electrical carriers.

6. The solid-state image sensing device according to claim 1, wherein the light-shielding member is extended over the photoelectric conversion portion from a side surface of the gate electrode.

7. The solid-state image sensing device according to claim 1, wherein the light-shielding member and the gate electrode are separated by an insulation film.

8. The solid-state image sensing device according to claim 7,
   wherein the light-shielding member and the gate electrode are electrically connected to each other, and
   wherein a contact that electrically connects the light-shielding member and the gate electrode is provided in the insulation film.

9. The solid-state image sensing device according to claim 1, wherein the device has a structure that draws out an electrode directly from the charge storage portion, the electrode being different from the light-shielding member.

10. The solid-state image sensing device according to claim 1, wherein a semiconductor region that acts as a potential barrier to the electrical carriers is formed between the photoelectric conversion portion and the charge storage portion under the gate electrode and apart from the gate electrode of the MOS transistor.

11. The solid-state image sensing device according to claim 1, wherein the light-shielding member is formed of a material that includes at least one of: tungsten, titanium, tantalum, and molybdenum.

* * * * *